(12) United States Patent
Chen et al.

(10) Patent No.: US 7,485,515 B2
(45) Date of Patent: Feb. 3, 2009

(54) METHOD OF MANUFACTURING METAL OXIDE SEMICONDUCTOR

(75) Inventors: Neng-Kuo Chen, Hsinchu (TW);
Teng-Chun Tsai, Hsinchu (TW);
Chien-Chung Huang, Taichung Hsien (TW)

(73) Assignee: United Microelectronics Corp., Hsinchu (TW)

( * ) Notice: Subject to any disclaimer, the term of this patent is extended or adjusted under 35 U.S.C. 154(b) by 261 days.

(21) Appl. No.: 11/308,641

(22) Filed: Apr. 17, 2006

(65) Prior Publication Data
US 2007/0243686 A1 Oct. 18, 2007

(51) Int. Cl.
*H01L 21/337* (2006.01)

(52) U.S. Cl. .................. 438/195; 438/197; 438/199; 438/301; 257/E21.006; 257/E21.177; 257/E21.433

(58) Field of Classification Search .......... 438/195, 438/630, 651, E21.006, E21.177, E21.296, 438/E21.4, E21.457
See application file for complete search history.

(56) References Cited

U.S. PATENT DOCUMENTS 6,573,172 B1  6/2003  En et al. .................... 438/626

| 2003/0040158 | A1  |   2/2003 | Saitoh |
| 2005/0269650 | A1* | 12/2005 | Pidin ............................ 257/411 |
| 2005/0285137 | A1  | 12/2005 | Satoh |
| 2006/0199326 | A1* |  9/2006 | Zhu et al. ..................... 438/201 |
| 2006/0214241 | A1* |  9/2006 | Pidin ............................ 257/407 |
| 2007/0090455 | A1* |  4/2007 | Lim et al. ..................... 257/338 |
| 2007/0102755 | A1* |  5/2007 | Adams et al. ................. 257/324 |
| 2007/0158739 | A1* |  7/2007 | Fischetti et al. .............. 257/327 |

FOREIGN PATENT DOCUMENTS

CN      101088150      12/2007

* cited by examiner

*Primary Examiner*—Walter L Lindsay, Jr.
*Assistant Examiner*—Cheung Lee
(74) *Attorney, Agent, or Firm*—Jianq Chyun IP Office

(57) ABSTRACT

A method of forming compressive nitride film is provided. The method includes performing a chemical vapor deposition (CVD) process to form a nitride film on a substrate, and the method is characterized by adding a certain gas, selected from among Ar, $N_2$, Kr, Xe, and mixtures thereof. Due to the addition of the foregoing certain gas, it can increase the compressive stress, thereby increasing PMOS drive current gain.

12 Claims, 6 Drawing Sheets

METHOD OF MANUFACTURING METAL OXIDE SEMICONDUCTOR

BACKGROUND OF THE INVENTION

1. Field of Invention

The present invention relates to a method of manufacturing a metal oxide semiconductor, and more particularly to a method of forming a compressive nitride film and a method of manufacturing a metal oxide semiconductor (MOS).

2. Description of Related Art

With semiconductor processes entering the era of the deep submicron meter, since increasing the NMOS and PMOS drive current will greatly improve the time-delay performance of transistor elements, a process for manufacturing a semiconductor of a size below 65 nm has been more and more important for increasing the NMOS and PMOS drive current. For example, there is conventional research on developing an ILD low dielectric constant (low k) material to increase the drive current. Recently, research on the influence of a shallow trench isolation (STI) oxide layer, the silicon nitride (SiN) stressor of the poly-cap, and the film stress of a SiN contact etching stop layer (SiN CESL) upon the drive current of transistor elements has appeared domestically and abroad.

As a result, the STI oxide, SiN stressor of the poly-cap, and the film stress of the SiN CESL are deposited into a compressive stress. The more the film is compressed, the more the PMOS drive current increases.

However, so far, through PECVD and at a temperature lower than 400° C., the most well-known As-deposit technology in the world can only reach −1.6 GPa. Therefore, how to further obtain a film with higher compressive stress has become a research issue in various fields.

SUMMARY OF THE INVENTION

Accordingly, an object of the present invention is to provide a method of forming a compressive nitride film, thereby obtaining a film with high compressive stress.

Another object of the present invention is to provide a method of manufacturing a metal oxide semiconductor (MOS), thereby increasing PMOS drive current gain.

Still another object of the present invention is to provide a method of manufacturing a MOS, thereby improving the structural stress of both PMOS and NMOS.

Yet another object of the present invention is to provide a method of manufacturing a MOS, thereby increasing the current gain while maintaining the existed element structure.

The present invention provides a method of forming a compressive nitride film, which includes performing a chemical vapor deposition (CVD) process to form a nitride film on a substrate. The method is characterized in that, a certain gas, selected from among Ar, $N_2$, Kr, Xe, and mixtures thereof, is added during the foregoing CVD process.

In the method of forming a compressive nitride film according to an embodiment of the present invention, when the certain gas is a combination of Ar and $N_2$, the flow of Ar is about 100 sccm-5000 sccm, and the flow of $N_2$ is about 1000 sccm-30000 sccm.

In the method of forming a compressive nitride film according to an embodiment of the present invention, the low frequency (LF) Power used by the foregoing CVD process is about 50 W-3000 W.

In the method of forming a compressive nitride film according to an embodiment of the present invention, the foregoing certain gas can be added in the early stage, middle stage, or late stage of the CVD process.

In the method of forming a compressive nitride film according to an embodiment of the present invention, the foregoing nitride film includes a silicon nitride film, a carbon-containing silicon nitride film, or an oxygen-containing silicon nitride film.

The present invention further provides a method of manufacturing a MOS, which includes: first, providing a substrate with at least one gate structure having already been formed thereon; then, forming a source and a drain in the substrate at both sides of the gate structure; and forming a metal silicide layer on the top surface of the gate structure and the surface of the source and the drain; after that, depositing a compressive dielectric film on the substrate to cover the gate structure, the source, and the drain. The method of depositing the compressive dielectric film includes adding a certain gas, selected from among Ar, $N_2$, Kr, Xe, and mixtures thereof, during the CVD process.

The present invention further provides a method of manufacturing a MOS, which includes: first, providing a substrate with a PMOS region and a NMOS region; forming a gate structure respectively on the PMOS region and the NMOS region of the substrate; then, forming a source and a drain in the substrate at both sides of each gate structure; and depositing a compressive dielectric film and a tensile dielectric film respectively on the PMOS region and the NMOS region of the substrate, to cover each gate structure, the source, and the drain. The method of depositing the foregoing compressive dielectric film includes adding a certain gas, selected from among Ar, $N_2$, Kr, Xe, and mixtures thereof, during the CVD process.

In the method of manufacturing a MOS according to another embodiment of the present invention, after forming each of the gate structures, the method further includes forming a first buffer layer on the substrate, to cover each gate structure.

In the method of manufacturing a MOS according to another embodiment of the present invention, after the source and the drain have been formed and before the first buffer layer is formed, the method further includes forming a metal silicide layer on the top surface of the gate structures and the surface of the source and the drain.

In the method of manufacturing a MOS according to another embodiment of the present invention, the tensile dielectric film is deposited after the compressive dielectric film has been deposited, and a second buffer layer can be formed on the substrate after the compressive dielectric film has been deposited and before the tensile dielectric film is deposited, so as to cover the foregoing compressive dielectric film.

In the method of manufacturing a MOS according to another embodiment of the present invention, the compressive dielectric film is deposited after the tensile dielectric film has been deposited, and a second buffer layer can be formed on the substrate after the tensile dielectric film has been deposited and before the compressive dielectric film is deposited, so as to cover the foregoing tensile dielectric film.

The present invention further provides a method of manufacturing a MOS, which includes: first, providing a substrate with at least one gate structure having been formed thereon; then, forming a source and a drain in the substrate at both sides of the gate structure; and depositing a compressive dielectric film on the substrate, to cover the gate structure, the source, and the drain, and the method of depositing the compressive dielectric film includes adding a certain gas, selected from among Ar, $N_2$, Kr, Xe, and mixtures thereof, during a CVD process; then, performing an annealing process; after that, removing the compressive dielectric film; then, forming a metal silicide layer on the top surface of each gate structure and on the surface of the source and the drain.

In the method of manufacturing a MOS according to the foregoing embodiments of the present invention, the LF power used in the forgoing CVD process is 50 W-3000 W.

In the method of manufacturing a MOS according to the foregoing embodiments of the present invention, when the certain gas is a combination of Ar and $N_2$, the flow of Ar is 100 sccm-5000 sccm; and the flow of $N_2$ is 1000 sccm-30000 sccm.

A method of manufacturing a MOS according to the foregoing embodiments of the present invention, the compressive dielectric film deposited includes a silicon nitride film, a carbon-containing silicon nitride film, or an oxygen-containing silicon nitride film.

A method of manufacturing a MOS according to the foregoing embodiments of the present invention, the above substrate can be one with crystallographic direction <100> at crystallographic plane (100).

Since a certain heavy gas is added during the CVD process to increase the bombard when a film is deposited in the present invention, a compact nitride film with high compressive stress is deposited; thus, the drive current gain of elements is increased. Also, the desired current gain is achieved in the present invention by using a thinner compressive nitride film; thus, the effect of a contact etching process window is also enhanced.

In order to the make aforementioned and other objects, features and advantages of the present invention comprehensible, preferred embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

The principle of the present invention is to add a heavy gas to increase the bombard during deposition, when a compressive dielectric film is formed through a chemical vapor deposition (CVD) process. Several embodiments will be illustrated below as examples of the present invention, but the present invention is not limited to the content described through the following embodiments.

The First Embodiment

A method of manufacturing a compressive nitride film according to a first embodiment of the present invention includes performing a CVD process to form a nitride film on a substrate. The CVD process is, for example, PECVD. Also, it is required to add a certain gas, selected from among Ar, $N_2$, Kr, Xe, and mixtures thereof, during the CVD process. For example, when the certain gas is a combination of Ar and $N_2$, the flow of Ar is about 100 sccm-5000 sccm; the flow of $N_2$ is about 1000 sccm-30000 sccm. Moreover, the low frequency (LF) Power used in the CVD process is preferably about 50 W-3000 W.

Table 1 below is a parameter table for the process of the method of the first embodiment (test example 1 and 2) compared with a conventional method (comparative example) without adding a certain gas of the present invention during the CVD process.

TABLE 1

|  | $SiH_4$ (sccm) | $NH_3$ (sccm) | Ar (sccm) | $N_2$ (sccm) | HF (W) | LF (W) (Bias) | Stress (GPa) |
| --- | --- | --- | --- | --- | --- | --- | --- |
| Comparative example | 240 | 3200 | 0 | 4000 | 100 | 0 | −0.07 |
| Test example 1 | 60 | 130 | 3000 | 1000 | 100 | 75 | −2.4 |
| Test example 2 | 60 | 40 | 4000 | 1000 | 100 | 200 | −2.5 |

As known from Table 1 that, the conventional method (comparative example) can only achieve a stress value up to −0.07 GPa; in contrary, the method (test example 2) of the present invention can achieve a stress value up to −2.5 GPa. Moreover, the certain gas can be added in the early stage, middle stage or late stage of the CVD process. The obtained nitride film can be a carbon(C)—containing silicon nitride film or n oxygen(O)—containing silicon nitride film, besides a silicon nitride film.

Figure 1:
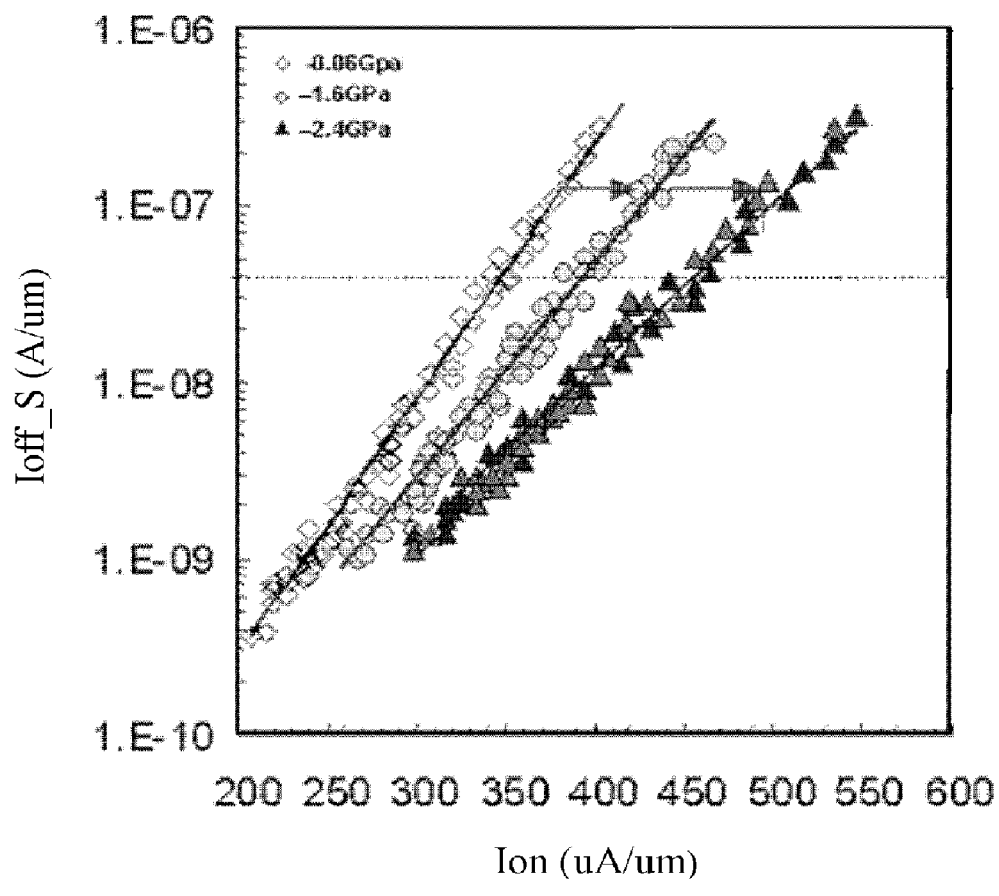
FIG. 1 is a comparative curve of a compressive silicon nitride film obtained by the present invention, a conventional silicon nitride film, and a conventional improved silicon nitride film at Ion against Ioff_S.

FIG. 1 is a comparative curve of a compressive silicon nitride film obtained by the present invention (the compressive stress is −2.4 GPa), a conventional silicon nitride film (the compressive stress is −0.06 GPa), and a conventional improved silicon nitride film (the compressive stress is −1.6 Gpa) at Ion against Ioff_S. The thickness of the films is about 800 angstroms, and the substrate has a crystallographic direction <100> at a crystallographic plane (100). Referring to FIG. 1, with the same Ioff_S value, the conventional improved silicon nitride film (−1.6 GPa) can obtain a higher Ion value than the conventional silicon nitride film (−0.06 GPa); the Ion value of the compressive silicon nitride film (−2.4 GPa) of the present invention is higher than that of the conventional improved silicon nitride film (−1.6 GPa). Thus, the present invention indeed can be used to increase the PMOS drive current gain.

Figure 2:
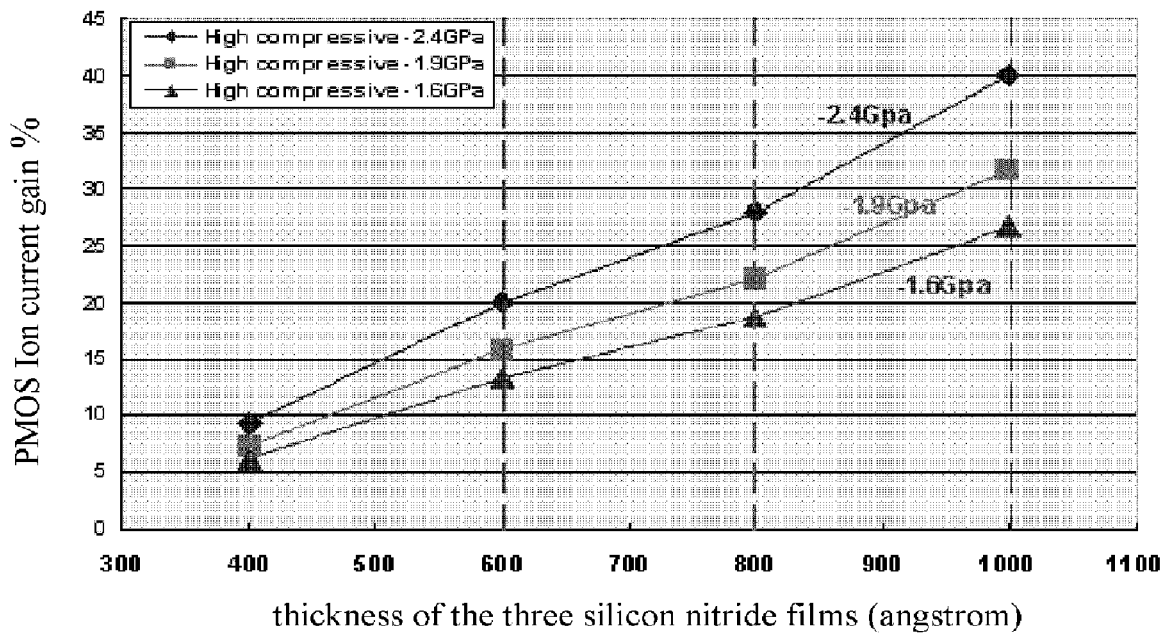
FIG. 2 is a comparative curve of the Ion current gain and thickness of the three silicon nitride films in FIG. 1.

FIG. 2 is a comparative curve of the Ion current gain and thickness of the three silicon nitride films in FIG. 1. Referring to FIG. 2, with the same Ion current gain (20%), the thickness of the conventional improved silicon nitride film (−1.6 GPa) must reach 850 angstroms. However, if the compressive silicon nitride film (−2.4 GPa) of the present invention is used, the film thickness can be reduced to about 600 angstroms, thus the contact etching process window will be greatly improved. Also, when the thickness of a silicon nitride film is increased to 1000 angstroms, the Ion current gain of the PMOS is increased to more than 40%.

In addition, the method provided by the present invention also can be applied to correct the chip warping issue caused by depositing multiple layers of thin films.

The Second Embodiment

FIGS. 3A to 3D are schematic cross-sectional views of a process of manufacturing a MOS according to a second embodiment of the present invention.

Figure 3A:
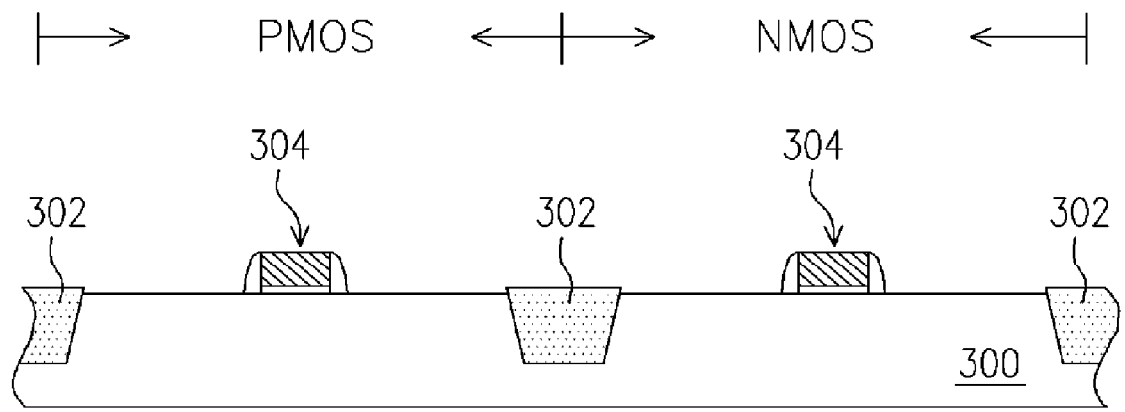
FIGS. 3A to 3D are schematic cross-sectional views of a process of manufacturing a MOS according to a second embodiment of the present invention.

Referring to FIG. 3A, a substrate 300 is first provided, which has a crystallographic direction <100> at a crystallographic plane (100). The substrate is supposed to be divided into a PMOS region and a NMOS region by a plurality of isolating structures 302. Gate structures 304 have already been formed on the substrate 300. The gate structure 304 substantially comprises a gate dielectric layer, a gate on the gate dielectric layer, and a spacer formed in the sidewall of the gate. Besides, other means are also included, which can be appreciated by those of ordinary skill in the technical field of the present invention through the current technique, and will not be repeated any more herein.

Figure 3B:
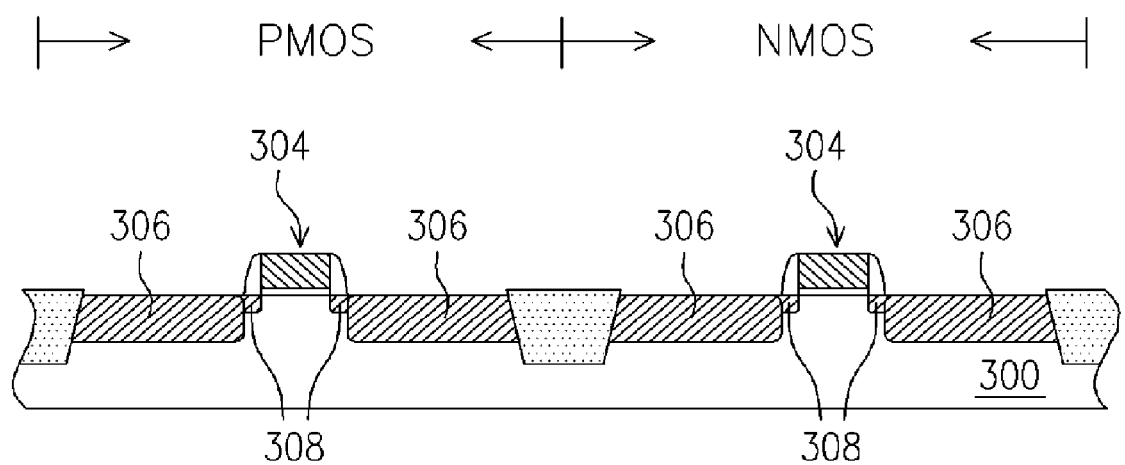

Then, referring to FIG. 3B, a source and a drain 306 are formed in the substrate 300 at both sides of gate structures 304 through ion-implantation process, for example. When the semiconductor process enters the era of deep submicron meter (below 65 nm), a selective epitaxial deposition process, for example, can be used to grow the source and the drain 306 directly in the substrate 300. In addition, an extending region 308 of the source and the drain can be formed below a part of the gate structures 304 before the source and the drain 306 are formed, so as to improve the short channel effects.

Figure 3C:
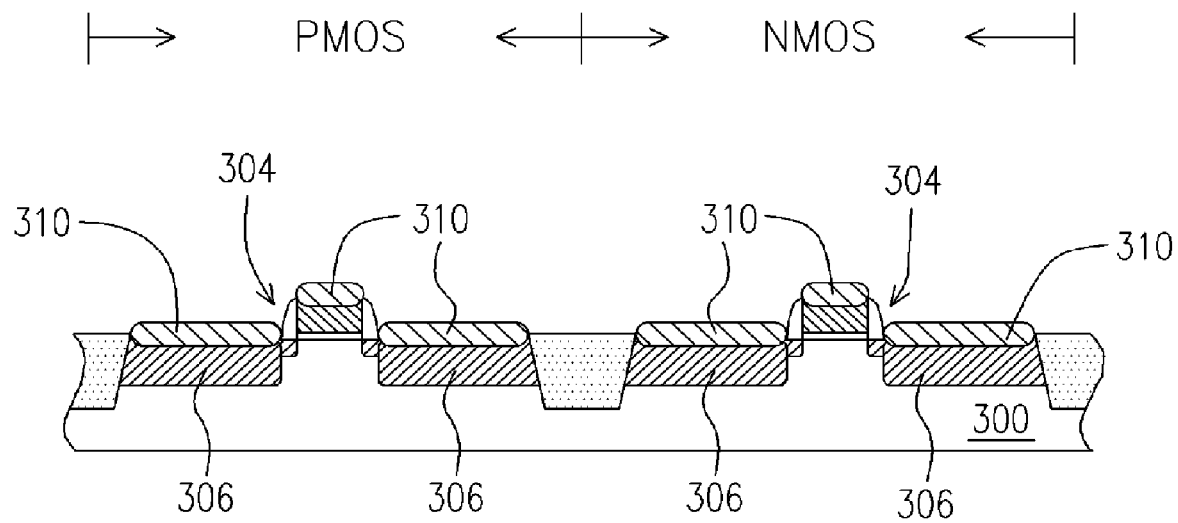
Figure 3D:
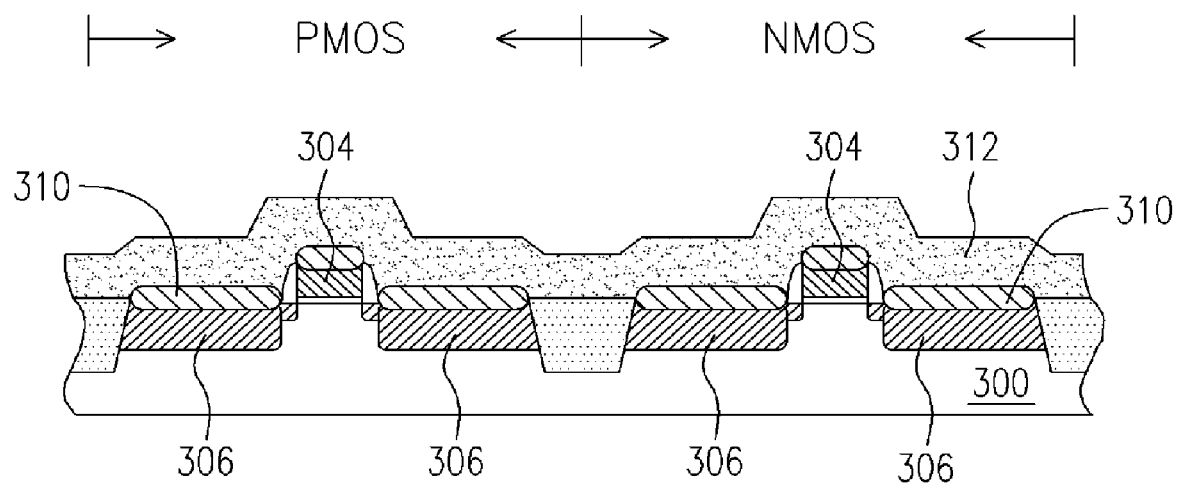

After that, the step of FIG. 3C may be performed first, or skipping to FIG. 3D directly. Referring to FIG. 3C, a metal silicide layer 310 may be firstly formed on the top surface of the gate structures 304 and on the surface of the source and the drain 306.

Then, referring to FIG. 3D, a compressive dielectric film 312 is deposited on the substrate 300 to cover the metal silicide layer 310. Certainly, if the step of FIG. 3D is performed just following the step of FIG. 3B, those covered by the compressive dielectric film 312 are the gate structures 304, the source and the drain 306, and the method of depositing the compressive dielectric film 312 is to add a certain gas, selected from among Ar, $N_2$, Kr, Xe, and mixtures thereof, during a CVD process. The LF Power used in the CVD process is, for example, 50 W-3000 W. Moreover, when the certain gas is a combination of Ar and $N_2$, for example, the flow of Ar can be 100 sccm-5000 sccm; the flow of $N_2$ can be 1000 sccm-30000 sccm. The compressive dielectric film 312 is, for example, a silicon nitride film, a carbon-containing silicon nitride film, or an oxygen-containing silicon nitride film.

The compressive dielectric film 312 in the above second embodiment functions as the contact etching stop layer (CESL) of the whole MOS, so as to achieve a lower stress.

The Third Embodiment

FIGS. 4A to 4D are schematic cross-sectional views of a process of manufacturing a MOS according to a third embodiment of the present invention.

Figure 4A:
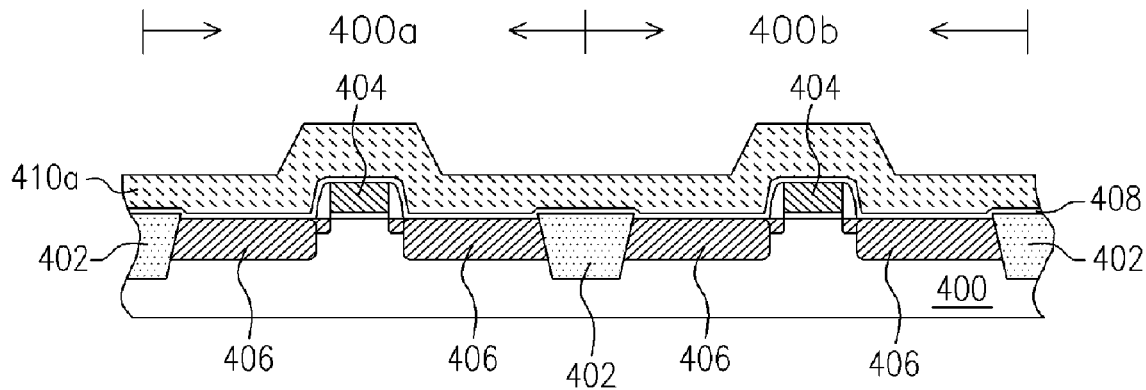
FIGS. 4A to 4C are schematic cross-sectional views of a process of manufacturing a MOS according to a third embodiment of the present invention.

Referring to FIG. 4A, a substrate 400 is first provided, which has a crystallographic direction <100> at a crystallographic plane (100). The substrate is supposed to be divided into a first region 400a and a second region 400b by a plurality of isolating structures 402. For example, if the first region 400a is the PMOS region, the second region 400b is the NMOS region. Then, a gate structure 404 is formed on the first region 400a and the second region 400b of the substrate 400 respectively. Thereafter, a source and a drain 406 are formed in the substrate 400 at both sides of each of the gate structures 404, and the way of forming the source and the drain 406 may be obtained with reference to the illustration of the second embodiment (shown in FIG. 3B). After that, it is decided to form a first buffer layer 408 on the substrate 400 to cover each of the gate structures 404, or otherwise, the next step is performed directly. Moreover, a metal silicide layer (not shown) may be formed on the top surface of each of the gate structures 404 and on the surface of the source and the drain 406, after the source and the drain 406 have been formed and before the first buffer layer 408 is formed.

Next, referring to FIG. 4A, a compressive dielectric film 410a is deposited on the substrate 400, and the method of depositing the compressive dielectric film 410a includes adding a certain gas, selected from among Ar, $N_2$, Kr, Xe, and mixtures thereof, during a CVD process. The low frequency power used in the above CVD process is, for example, 50 W-3000 W. Moreover, when the certain gas is a combination of Ar and $N_2$, the flow of Ar is, for example, 100 sccm-5000 sccm; the flow of $N_2$ is, for example, 1000 sccm-30000 sccm. The compressive dielectric film 410a can be a silicon nitride film, a carbon-containing silicon nitride film, or an oxygen-containing silicon nitride film.

Figure 4B:
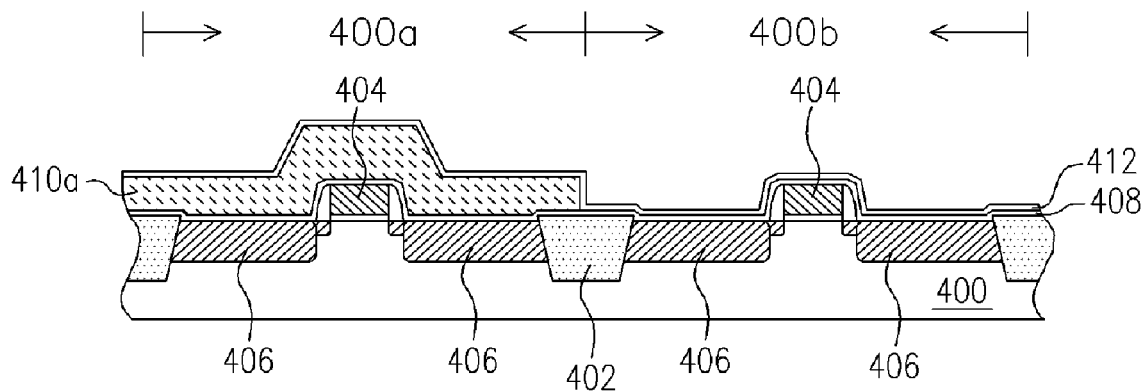

Then, referring to FIG. 4B, the compressive dielectric film 410a on the second region (i.e., NMOS region) 400b is removed, and a second buffer layer 412 is formed on the substrate 400 to cover the compressive dielectric film 410a.

Figure 4C:
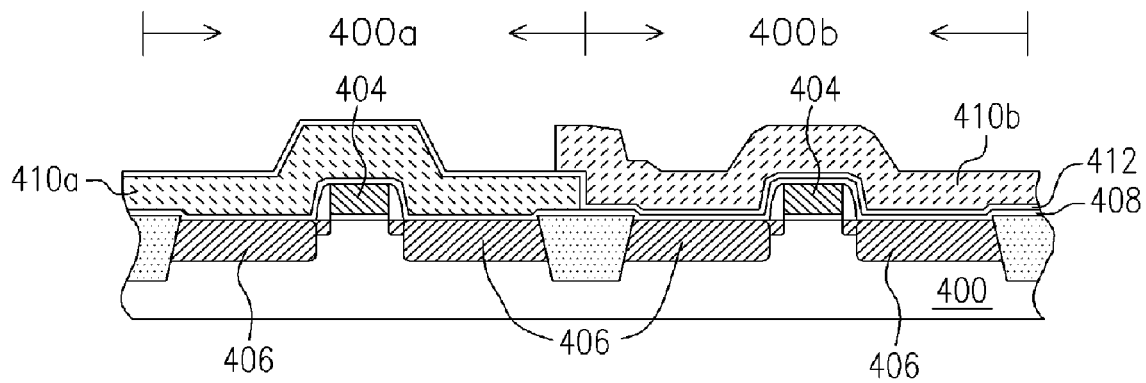

Then, referring to FIG. 4C, a tensile dielectric film 410b is deposited on the second region (i.e., NMOS region) 400b of the substrate 400 to cover each layer structure of this region 400b. Therefore, the third embodiment can be used to improve the structural stress of both the PMOS region and the NMOS region.

Moreover, if the first region 400a in FIGS. 4A to 4C is referred as the NMOS region, and the second region 400b is referred as the PMOS region, the compressive dielectric film can be deposited after the tensile dielectric film has been deposited according to this embodiment. Also, a second buffer layer 412 may be formed on the substrate 400 after the tensile dielectric film has been deposited and before the compressive dielectric film is deposited, so as to cover the tensile dielectric film.

The Fourth Embodiment

FIGS. 5A to 5E are schematic cross-sectional views of a process of manufacturing a MOS according to a fourth embodiment of the present invention.

Figure 5A:
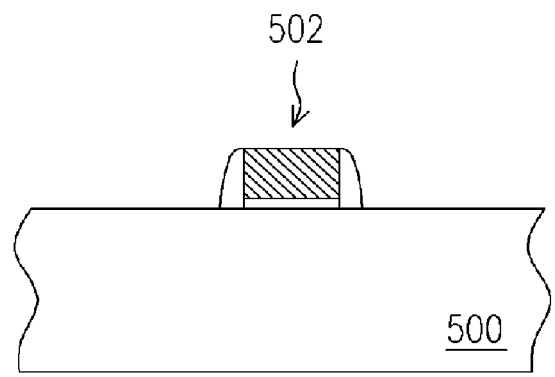
FIGS. 5A to 5E are schematic cross-sectional views of a process of manufacturing a MOS according to a fourth embodiment of the present invention.

Referring to FIG. 5A, a substrate 500 is first provided, which has a crystallographic direction <100> at a crystallographic plane (100). A gate structure 502 has already been formed on the substrate 500. Then, a source and a drain 504 are formed in the substrate 500 at both sides of the gate structure 502. In addition, an extending region 506 of the source and the drain may be formed below a part of the gate structure 502 before the source and the drain 504 are formed, so as to improve the short channel effects.

Figure 5B:
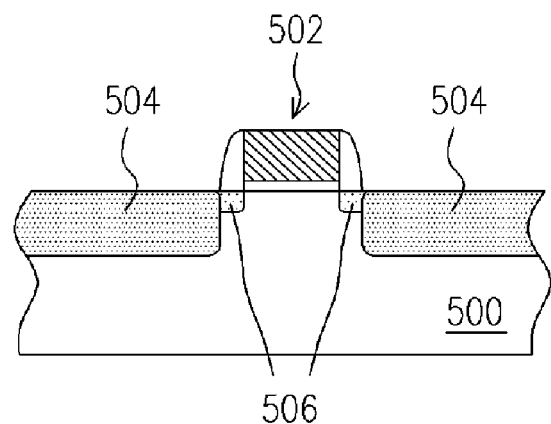
Figure 5C:
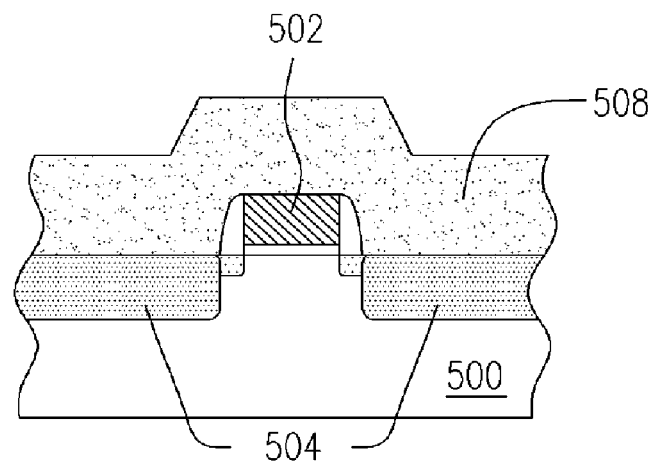

Next, referring to FIG. 5B, a compressive dielectric film 508 is deposited on the substrate 500 to cover the gate structure 502, the source and the drain 504, and the method of depositing the compressive dielectric film 508 includes adding a certain gas, selected from among Ar, $N_2$, Kr, Xe, and mixtures thereof, during a CVD process. For example, when the certain gas is a combination of Ar and $N_2$, the flow of Ar can be 100 sccm-5000 sccm; the flow of $N_2$ can be 1000 sccm-30000 sccm. The LF power used in the CVD process is, for example, 50 W-3000 W. In addition, the compressive dielectric film 508 deposited can be a silicon nitride film, a carbon-containing silicon nitride film, or an oxygen-containing silicon nitride film.

Figure 5D:
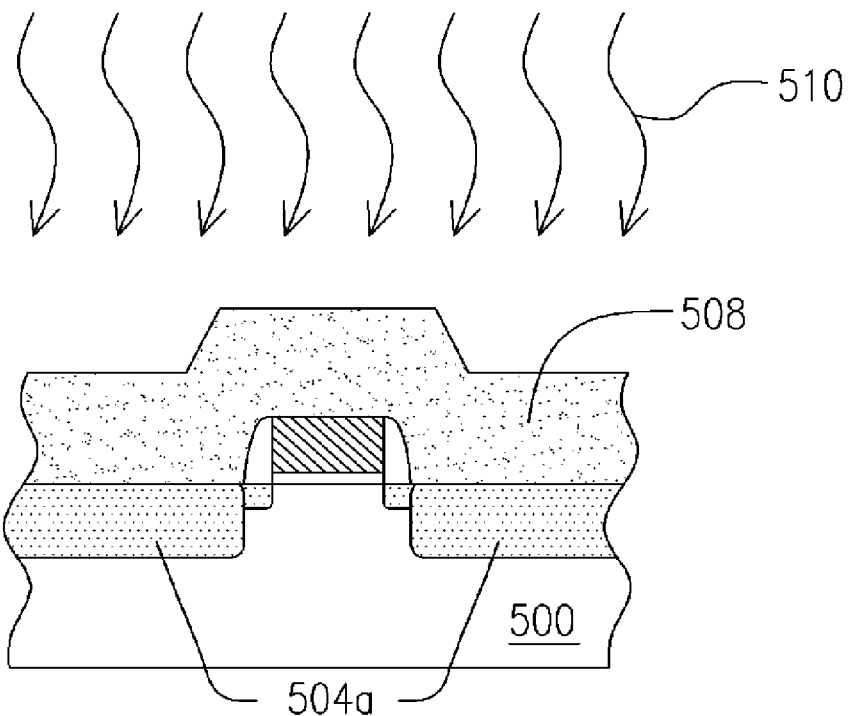

Then, referring to FIG. 5D, an annealing process 510 is performed, such as a source/drain annealing process. At this time, the compressive dielectric film 508 will become a poly stressor, so that the polysilicon layer on the substrate 500 can memorize its stress.

Figure 5E:
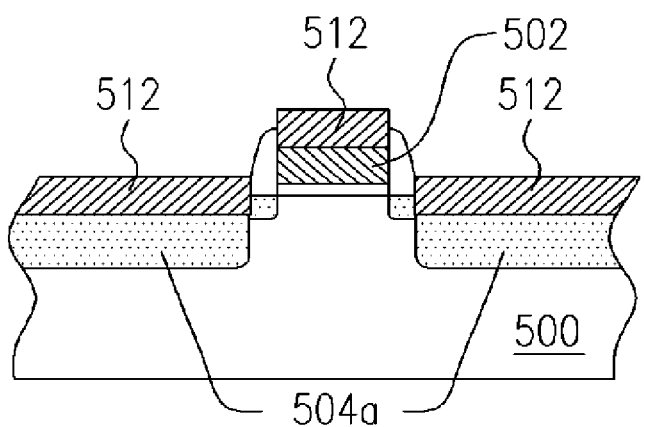

Next, referring to FIG. 5E, the compressive dielectric film (508 in FIG. 5D) is removed, and a metal silicide layer 512 is formed on the top surface of the gate structure 502 and on the surface of the source and the drain 504a. Therefore, the method of the fourth embodiment not only increases the current gain, but meanwhile maintains the existing element structure.

In summary, in the method of the present invention, it is required to add a certain heavy gas during the CVD process to increase the bombard when depositing a film, thus, a compact nitride film with high compressive stress can be deposited, and the thickness of the compressive nitride film is meanwhile reduced, so as to enhance the contact etching process window.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a metal oxide semiconductor (MOS), comprising:
    providing a substrate with a PMOS region and an NMOS region;
    forming a gate structure respectively on the PMOS region and the NMOS region of the substrate;
    forming a source and a drain in the substrate at both sides of each of the gate structures;
    forming a first buffer layer on the substrate to cover each of the gate structures, the source, and the drain;
    depositing a compressive dielectric film on the PMOS region of the substrate to cover the first buffer layer on the gate structures, the source, and the drain in the PMOS region, wherein
    the method of depositing the compressive dielectric firm comprises adding a certain gas during a CVD process, wherein the certain gas is selected from among Ar, $N_2$, Kr, Xe, and mixtures thereof; and
    forming a second buffer layer on the substrate after the compressive dielectric film has been deposited, so as to cover the compressive dielectric film in the PMOS region and the first buffer layer in the NMOS region and
    depositing a tensile dielectric film on the second buffer layer in the NOMS region.

2. The method of manufacturing the MOS as claimed in claim 1, wherein, when the certain gas is a combination of Ar and $N_2$, the flow of Ar is 100 sccm-5000 sccm and the flow of $N_2$ is 1000 sccm-30000 sccm.

3. The method of manufacturing the MOS as claimed in claim 1, wherein the LF power used in the CVD process is 50 W-3000 W.

4. The method of manufacturing the MOS as claimed in claim 1, further comprising forming a metal silicide layer on the top surface of each of the gate structures and on the surface of the source and the drain, after the source and the drain have been formed and before the first buffer layer is formed.

5. The method of manufacturing the MOS as claimed in claim 1, wherein the deposited compressive dielectric film comprises a silicon nitride layer, a carbon-containing silicon nitride layer, or an oxygen-containing silicon nitride layer.

6. The method of manufacturing the MOS as claimed in claim 1, wherein the substrate has crystallographic direction <100> at crystallographic plane (100).

7. A method of manufacturing a metal oxide semiconductor (MOS), comprising:
    providing a substrate with a PMOS region and an NMOS region;
    forming a gate structure respectively on the PMOS region and the NMOS region of the substrate;
    forming a source and a drain in the substrate at both sides of each of the gate structures;
    forming a first buffer layer on the substrate to cover each of the gate structures, the source, and the drain;
    depositing a tensile dielectric film on the NMOS region of the substrate, to cover the first buffer layer on the gate structures, the source, and the drain in the NMOS region,
    forming a second buffer layer on the substrate after the tensile dielectric film has been deposited, so as to cover the tensile dielectric film in the NMOS region and the first buffer layer in the PMOS region; and
    depositing a compressive dielectric film on the PMOS region to cover the second buffer layer formed in the PMOS region, wherein the method of depositing the compressive dielectric film comprises adding a certain gas during a CVD process, and the certain gas is selected from among Ar, $N_2$, Kr, Xe, and mixtures thereof.

8. The method of manufacturing the MOS as claimed in claim 7, wherein, when the certain gas is a combination of Ar and $N_2$, the flow of Ar is 100 sccm-5000 sccm and the flow of $N_2$ is 1000 sccm-30000 sccm.

9. The method of manufacturing the MOS as claimed in claim 7, wherein the LF power used in the CVD process is 50 W-3000 W.

10. The method of manufacturing the MOS as claimed in claim 7, further comprising forming a metal silicide layer on the top surface of each of the gate structures and on the surface of the source and the drain, after the source and the drain have been formed and before the first buffer layer is formed.

11. The method of manufacturing the MOS as claimed in claim 7, wherein the deposited compressive dielectric film comprises a silicon nitride layer, a carbon-containing silicon nitride layer, or an oxygen-containing silicon nitride layer.

12. The method of manufacturing the MOS as claimed in claim 7, wherein the substrate has crystallographic direction <100> at crystallographic plane (100).

* * * * *